United States Patent [19]

Rocci et al.

[11] Patent Number: 5,058,198
[45] Date of Patent: Oct. 15, 1991

[54] RADIO FREQUENCY TAP UNIT WHICH CAN BE RECONFIGURED WITH MINIMAL DISRUPTION OF SERVICE

[75] Inventors: Joseph D. Rocci, Lansdale; Michael Quelly, Quakertown; Robert Hallett, Phoenixville; Norman W. Moore, Willow Grove, all of Pa.

[73] Assignee: AM Communications, Inc., Quakertown, Pa.

[21] Appl. No.: 331,687

[22] Filed: Mar. 31, 1989

[51] Int. Cl.$^5$ .......................... H01P 5/18; H04H 7/48
[52] U.S. Cl. ........................................ 455/3; 333/109; 333/132; 358/86; 455/6
[58] Field of Search .................... 455/3, 4, 5, 307, 338; 358/84, 186; 333/100, 105, 109, 110, 132, 117, 112; 655/6

[56] References Cited

U.S. PATENT DOCUMENTS

| | | | |
|---|---|---|---|
| 4,367,557 | 1/1983 | Stern et al. | 455/4 |
| 4,450,481 | 5/1984 | Dickinson | 358/114 |
| 4,578,702 | 3/1986 | Campbell, III | 358/86 |
| 4,755,776 | 7/1988 | Preschutti | 333/100 |
| 4,810,898 | 3/1989 | Rocci et al. | 307/115 |

Primary Examiner—Curtis Kuntz
Assistant Examiner—Chi H. Pham
Attorney, Agent, or Firm—Ratner & Prestia

[57] ABSTRACT

A modular cable television tap unit includes a base module which receives a cable television signal having an operational power signal component from a cable distribution network. The base unit includes circuitry for separating radio frequency (RF) components and the operational power signal component from the cable television signal. The separated operational power signal is passed through the base module to another cable in the network. The base module includes a set of connectors for receiving a removable directional coupler module and a single connector for receiving a removable addressable signal splitter module. The signal splitter module includes connectors for providing the RF components of the cable television signal to subscribers. The connection for the directional coupler module provides only the RF component of the cable television signal. The connection for the signal splitter module provides a compound signal which includes an RF signal provided by the directional coupler module and the operational power signal component of the cable television signal for operating the addressable tap circuitry. A relatively large number of different types of tap units having different tap loss values and different numbers of subscriber connections may be made from a relatively small number of different module types.

10 Claims, 9 Drawing Sheets

DIRECTIONAL COUPLER MODULE 416

2-WAY SPLITTER 822

SWITCH ELEMENT OF SWITCH NETWORK 356

RADIO FREQUENCY TAP UNIT WHICH CAN BE RECONFIGURED WITH MINIMAL DISRUPTION OF SERVICE

BACKGROUND OF THE INVENTION

The present invention relates generally to a radio frequency (RF) distribution network and in particular to a modular radio frequency signal tapping system that is useful in a broadband signal transmission network.

Broadband networks are commonly used to transport video signals and digital data to users who may be distributed over a wide area. This application is primarily concerned with a particular type of broadband network, a cable television distribution system. However, the principles set forth herein are generally applicable to other types of broadband network. In a typical cable television distribution system, several television signals, each having a bandwidth of approximately 6 MHz, are frequency division multiplexed onto one coaxial cable by modulating respective radio frequency carrier signals with the television signals. These carrier signals may have frequencies ranging from 5 MHz to 550 MHz in increments of 6 MHz. The combined signal is distributed to the public via a coaxial cable transmission network.

Due to frequency dependent transmission losses in coaxial cables, signal levels tend to diminish as the signal propagates away from the transmission source. The losses at higher frequencies are generally greater than those at lower frequencies. To compensate for these transmission losses, amplifiers are placed between coaxial cable spans in the cable system to restore the signal to its original amplitude. These amplifiers are configured to have a frequency response characteristic that tends to amplify the high frequency components of the signal more than the low frequency components to equalize the transmission losses. A typical cable network may include as many as 30 amplifiers in one line and may have cable spans of up to 1500 feet between the amplifiers.

A tap is inserted in the coaxial cable at locations along a cable span where the transmitted signal is provided to one or more subscribers. As used in this description, a tap is a signal coupler which sends a prescribed amount of signal energy from the cable to a subscriber and passes the remainder to subscribers farther along the network. A typical tap may have outlets for up to eight subscribers. The amount of signal energy provided to a subscriber depends on two factors, the available signal energy at the tap and the coupling coefficient of the tap. As used herein, the coupling coefficient of a tap is the amount of signal energy provided to the subscribers divided by the amount of signal energy applied to the tap. Generally, taps having a relatively small coupling coefficient are used near the start of a cable span, where the signal is strong and taps having a relatively large coupling coefficient are used near the end of the cable span where the signal is weak.

A cable television network is desirably configured so that each subscriber receives approximately the same signal level. Accordingly, a cable network designer wants to have a relatively large number of different types of tap modules available for his use. For example, a typical cable television network may use taps having 12 different coupling coefficients and four different subscriber outlet configurations (i.e. for two, four, six or eight subscribers). Thus an equipment manufacturer may be asked to supply its customers with a total of 48 different tap types.

Moreover, during normal operation, taps in the network may fail and need to be replaced. Since most cable operators rely on customer complaints to determine when the system has failed, it may be relatively difficult to determine exactly which tap in the network has failed. Accordingly, the cable operator may need to stock his service trucks with one tap of each type to ensure that any fault may be corrected with one service call.

When a tap is serviced, it is often removed and replaced. If this operation breaks the signal connection to the subscribers farther down the line, the operator may receive many unnecessary complaints from the affected subscribers.

SUMMARY OF THE INVENTION

The present invention is embodied in a modular RF tap for a wideband signal distribution network. The wideband signal conveyed by the network has an RF component signal that is frequency division multiplexed with a component that provides operational power to elements of the network. The network includes spans of radio frequency cable coupled by RF tap units. A modular RF tap unit in accordance with the present invention includes an input port for receiving a wideband signal. The tap includes a base unit which separates the operational power and RF signal components from the received wideband signal. The operational power component is passed from the input port to an output port of the tap. The base unit further includes a first connector for providing the RF component of the wideband signal to a signal coupler circuit. The signal coupler has a first connector for coupling with the first connector of the base unit, apparatus for separating the RF component provided by the base unit into first and second signals, a second connector for applying the first separated signal to a second connector of the base unit and a third connector for providing the second separated signal. The tap further includes a signal splitter having an input connector for coupling to receive the second separated signal. The signal splitter divides this signal into a plurality of signals to be provided to the users.

DETAILED DESCRIPTION

Figure 1:
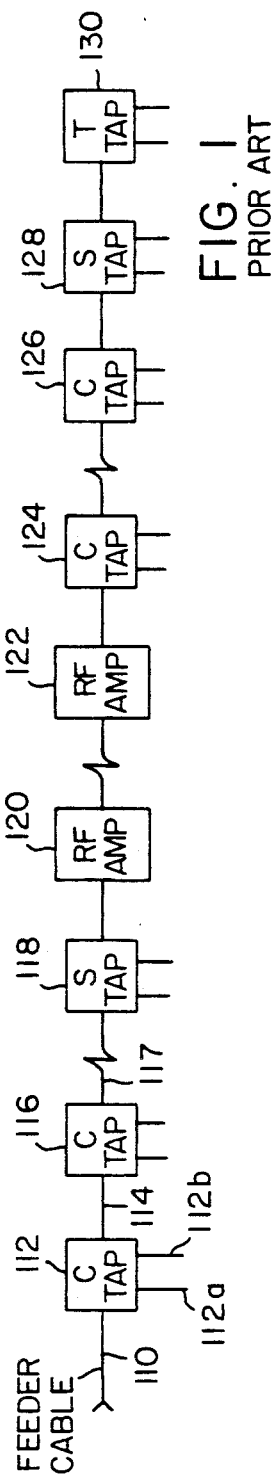
FIG. 1 (prior art) is a block diagram of a portion of a cable television distribution system.

The wideband RF tap described below has a modular construction. It includes three parts, a base unit, a directional coupler and a signal splitter. The base unit couples two cable spans together. It conveys a power signal component and an RF signal component through the tap. The directional coupler module plugs into the base unit to separate a portion of the RF signal for use by the signal splitter. The signal splitter module also plugs into the base unit. Through this connection, it receives operational power and the portion of the RF signal separated by the directional coupler. The splitter divides this signal among a number of RF connectors to provide each subscriber coupled to the tap with substantially the same signal level.

The apparatus described below includes one type of base unit module, 12 different types of directional coupler modules and four different types of signal splitter modules. Any of 48 tap types commonly used by a cable operator may be built by combining one of the directional coupler modules and one of the signal splitter modules with the base unit module. Thus, using the system described below greatly reduces the inventory overhead for a cable television operator.

The individual modules in the embodiment of the invention described below are configured to simplify the repair of a defective tap unit. The RF signal and operational power signal passed by the base unit from one cable span to the next are not significantly disrupted when the directional coupler module, the signal splitter module or both are removed from the tap unit. Consequently, fixing one broken tap in the distribution system will not generate complaints from other subscribers whose service would otherwise be disrupted.

In addition, since the directional coupler module does not convey operational power, it may be designed to be a relatively small module, using inexpensive low-power components. This coupler module design also reduces potential electric shock hazards to service personnel relative to a coupler which passes electrical power.

The signal splitter modules used in this embodiment of the invention receive both RF and operational power signals via a single connector from the base unit. These modules are designed with power efficient complementary metal-oxide-semiconductor (CMOS) technology, thus, its power requirements are relatively low. This design feature reduces the potential electric shock hazard to service personnel and reduces the power requirements for the cable operator.

A signal splitter module may include between two and eight subscriber output terminals. The splitter module includes circuitry which allows any of these output terminals to be disconnected from the cable system via a command sent along the cable system from a remote location. The shut-off operation is accomplished using RF relay circuitry. This circuitry strongly attenuates signals provided to the subscriber and terminates the output port of the splitter. This prevents amplitude response changes at other subscriber ports and maintains signal input impedance.

To understand the operation of the embodiment of the invention described below, it is helpful to understand how a typical cable television distribution system operates. FIG. 1, labeled Prior Art, is a block diagram of one branch line of a conventional cable television distribution network. An RF signal which may occupy a band of frequencies between 5 MHz and 550 MHz and a 60 volt alternating current (AC) power signal are generated at the head end (not shown) of the cable network and applied to a feeder cable 110. The feeder cable is connected to the input port of a coupling tap (C-tap) 112. Power supply circuits (not shown) which increase the level of the operational power signal are also inserted in the cable span as necessary.

The C-tap 112 separates a relatively small portion of the signal provided by the feeder cable 110 and provides the separated portion to subscribers via terminals 112a and 112b. The remainder of the signal provided by the feeder cable 110 is passed to one end of a cable span 114 coupled to the output port of the C-tap 112. The other end of the cable span 114 is coupled to the input port of a C-tap 116. This C-tap also separates a small portion of the signal applied to its input port and provides this separated portion to subscribers. The remainder of the signal is passed through the tap to a cable span 117.

The alternation of C-taps and cable spans continues as long as the signal levels passed by the cable spans are sufficient to allow a usable portion of the signal to be separated using a directional coupler. When the signal falls below this level, the cable span is coupled to a splitter tap (S-tap) instead of a C-tap. In FIG. 1, this is illustrated by the S-tap 118. An S-tap includes two-way signal splitter circuitry in place of the directional coupler. The S-tap 118 provides one-half of the signal applied to its input port to the subscribers and provides the other half to an RF amplifier 120. The amplifier 120 increases the amplitude of the RF signal to a level sufficient to drive another string of taps.

At some point on the branch line, the noise level of the available signal is too great to permit further amplification. In this instance, the signal provided by an S-tap is applied to a terminating tap. In FIG. 1 this is illustrated by the S-tap 128 and terminating tap 130. A terminating tap may be formed, for example, by replacing the two-way splitter of an S-tap with a conductor.

In the cable network branch shown in FIG. 1, each of the taps is passive, that is to say, the taps merely channel signals from the cable network to the subscribers. The operational power signal is used only for RF amplifiers such as elements 120 and 122. However the same general structure applies to a cable network which uses active taps, that is to say taps which draw operational power from the cable network. Active taps may include circuitry for monitoring or disabling the signal delivered to the subscribers and for establishing a communication link between the subscriber and the head-end of the network.

Figure 2:
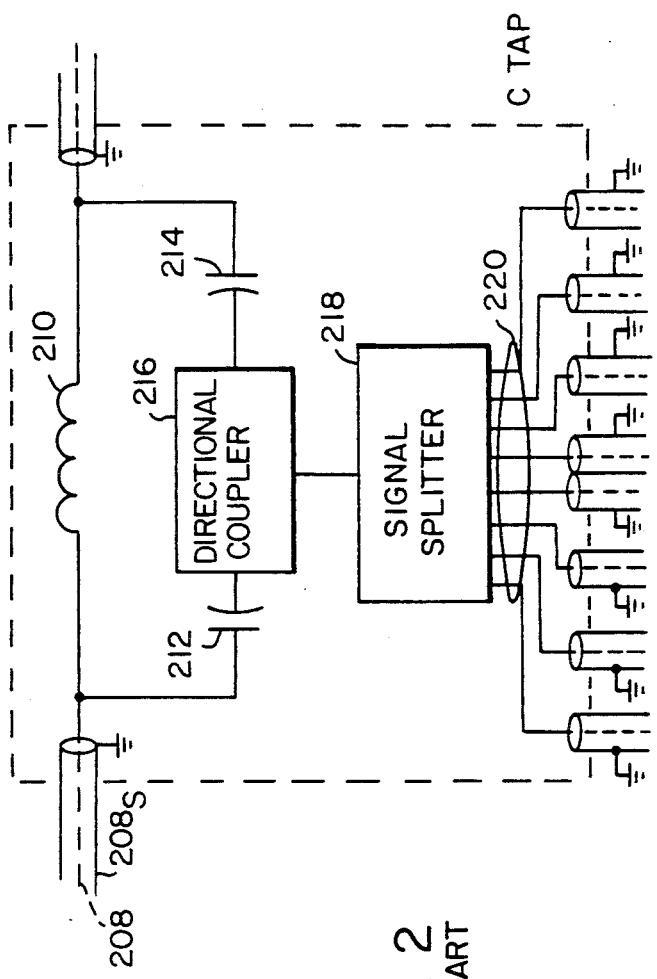
FIG. 2 (prior art) is a block diagram of an exemplary tap unit for use in the portion of the cable television distribution system shown in FIG. 1.

FIG. 2, labeled Prior Art, illustrates the structure of a typical passive C-tap. The combined operational power and RF signal is applied to the tap via a shielded transmission cable 208. Inside the tap, the operational power component of the signal is passed to an output cable 209 via a inductor 210. The inductor 210 is selected to provides a relatively large impedance to the RF signal component and a negligible impedance to the operational power signal, which, in the present embodiment of the invention is a 60 Hz AC signal.

The RF component signal is passed from the input cable 208 to the output cable 209 by a capacitor 212, a directional coupler 216 and a capacitor 214. The capacitors 212 and 214 are selected to have a capacitance that provides a relatively high impedance to the operational power signal and a negligible impedance to the RF signal.

The directional coupler 216 divides the signal applied to its input port into two portions. One portion is passed through to the output cable and the other portion is applied to signal splitter circuitry 218. The circuitry 218 may include, for example, a network of hierarchically coupled two-way splitters which successively halve the signal provided by the directional coupler 218 to produce eight subscriber signals. The subscriber signals are provided by the splitter circuitry via signal transmission cables 220. As shown in FIG. 2, the ground connection provided by the cable shield 208s is used to ground the shields of the output cable 209 and each of the subscriber cables 220.

Figure 3:
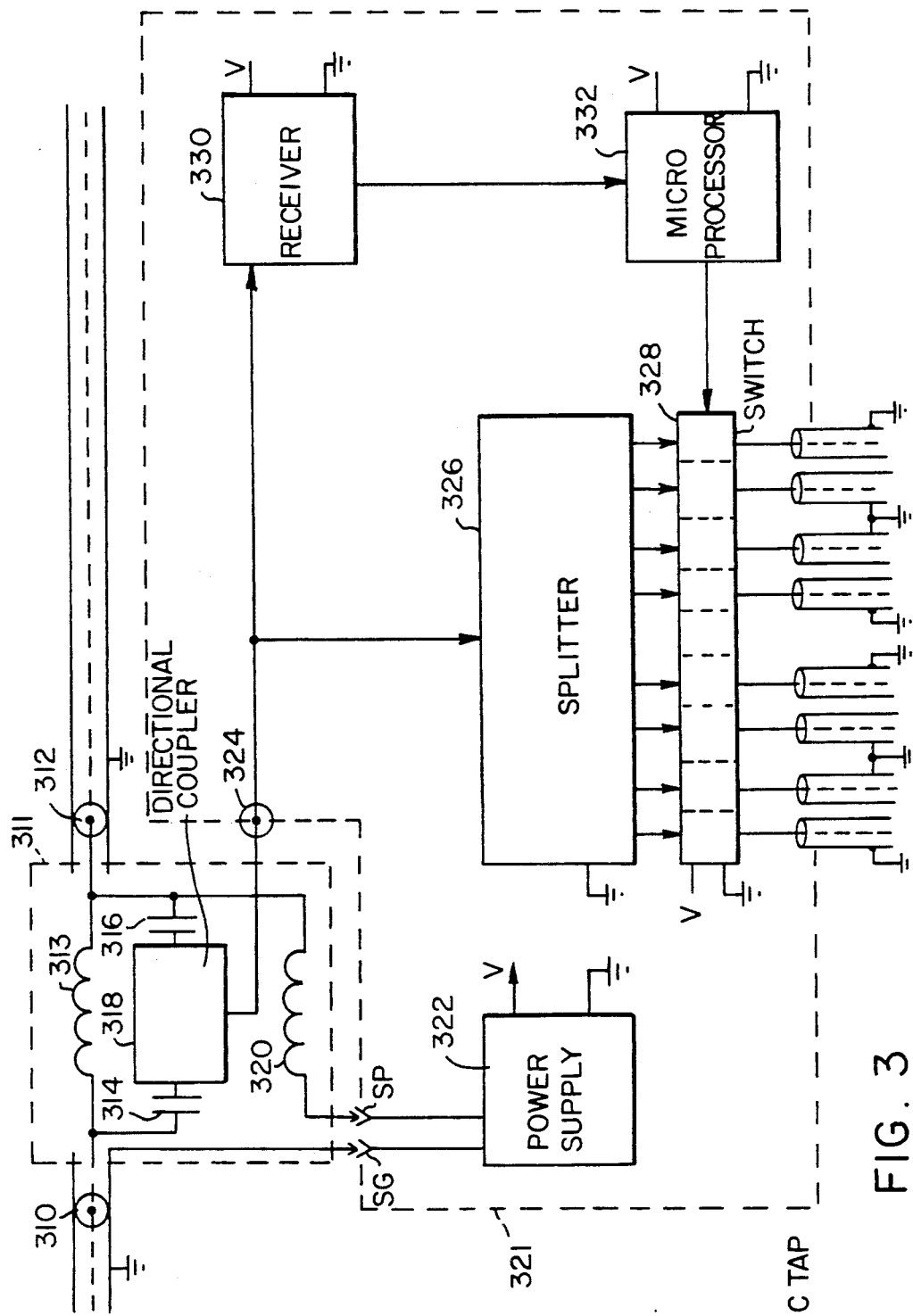
FIG. 3 (prior art) is a block diagram of a modular tap unit suitable for use in the portion of the cable television distribution system shown in FIG. 1.

FIG. 3, labeled Prior Art, is a block diagram, partially in schematic diagram form of an active C-tap. The circuitry shown in FIG. 3 is a simplified diagram of tap circuitry described in U.S. Pat. No. 4,450,481 entitled "TAMPER-RESISTANT, EXPANDABLE COMMUNICATIONS SYSTEM," which is hereby incorporated by reference. This unit is called an active tap because it may be programmed, inter alia, to block signals provided to an individual subscriber.

The C-tap shown in FIG. 3 comprises three component parts, a housing which includes RF connectors 310 and 312, a signal coupling circuit 311 and a signal splitter 321. The signal coupling circuit 311 connects to cable spans in the distribution network by the RF connectors 310 and 312. When the network 311 is removed from this C-tap, The RF and power connections are broken to taps farther down the branch of the cable network. The signal splitter 321 connects to the signal coupling circuit via three connectors: an RF connector 324 and two operational power connectors SG and SP.

The signal coupling circuit 311 includes a inductor 313, capacitors 314 and 316 and a directional coupler 318 which correspond to the respective elements 210, 212, 214 and 216 of the passive C-tap shown in FIG. 2. The inductor 320 is included in the coupling circuitry 311 to pass the power signal component from the output port of the coupling circuitry 311 to the power input connector SP of the signal splitting circuitry 321. The connector SG of the signal splitting circuitry 321 is coupled to the shield 310s of the cable 310 as a source of reference potential (e.g. ground).

The signal splitter circuitry 321 includes a power supply circuit which converts the AC power signal provided at the terminals SG and SP into a direct current (DC) operating potential V. This operating potential is used by components of the signal splitting circuitry 321 as set forth below.

The main component of the circuitry 321 is a hierarchical signal splitter 326. This splitter may be identical to the splitter 218 described above in reference to FIG. 2. The output signals of the splitter 326 are applied provided to subscribers via a switch network 328. The network 328 includes one RF switch for each signal provided by the splitter 326. These RF switches are controlled by a microprocessor 332 which receives control signals from the cable distribution system via a receiver 330. In the system shown in FIG. 3, these signals are modulated onto a carrier signal having a frequency outside of the band of frequencies occupied by the RF television signals.

The signals provided by the receiver 330 control the switch 328 to selectively provide RF signal to ones of the subscriber taps 430. A tap having the ability to remotely connect or disconnect a subscriber is known in the industry as an addressable tap.

Figure 4:
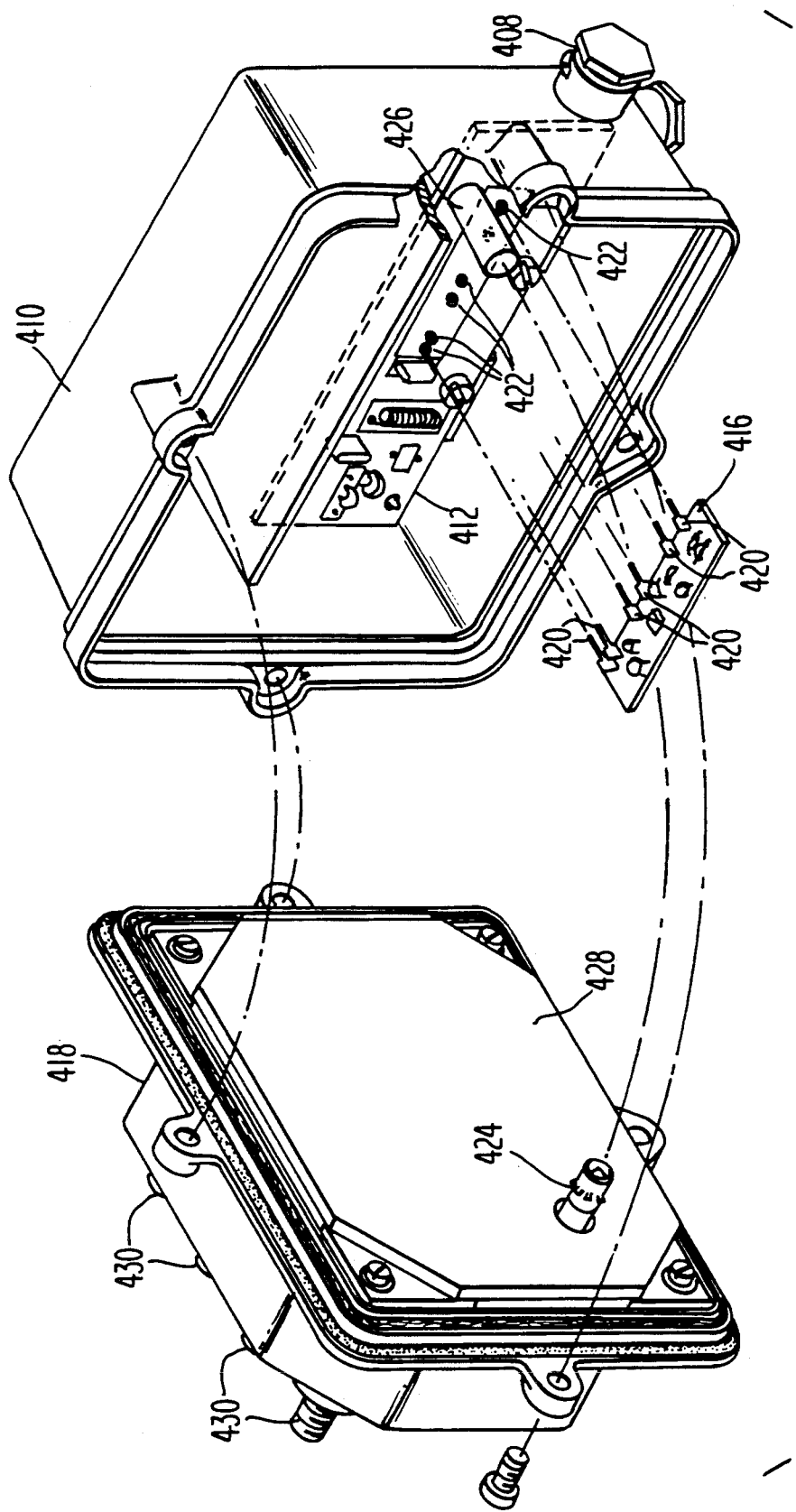
FIG. 4 is a perspective view of a tap unit which includes an embodiment of the present invention.

With this background, an RF tap in accordance with the present invention is now described. FIG. 4 is a perspective view of the exemplary tap. The tap includes three modules, a base unit 410, a plug-in directional coupler 416 and a plug-in splitter 418.

Input signals are applied to the tap via an RF connector 408. A mother-board assembly 412 in the base unit 410 separates the operational power component from the input signals and channels this signal to an output RF connector 409 (shown in FIG. 5). The assembly 412 includes connectors 422 for coupling the directional coupler 416 to the base unit. The directional coupler module 416 includes connecting pins 420 aligned to fit the connectors 422 on the mother-board assembly 412. An RF connector 426 is also included on the mother-board 412 to couple the splitter module to the tap. This connector joins with a connector 424 on the splitter module 418. As illustrated in FIG. 4, the directional coupler module 416 and the signal splitter module 418 are configured for easy removal from the mother-board assembly 412. The circuitry for the splitter module 418 is implemented on a printed circuit board 510 (shown in FIG. 5) mounted beneath an RF shield 42B. Subscriber signals are provided by RF connectors 430 mounted on the front of the splitter module 418.

Figure 5:
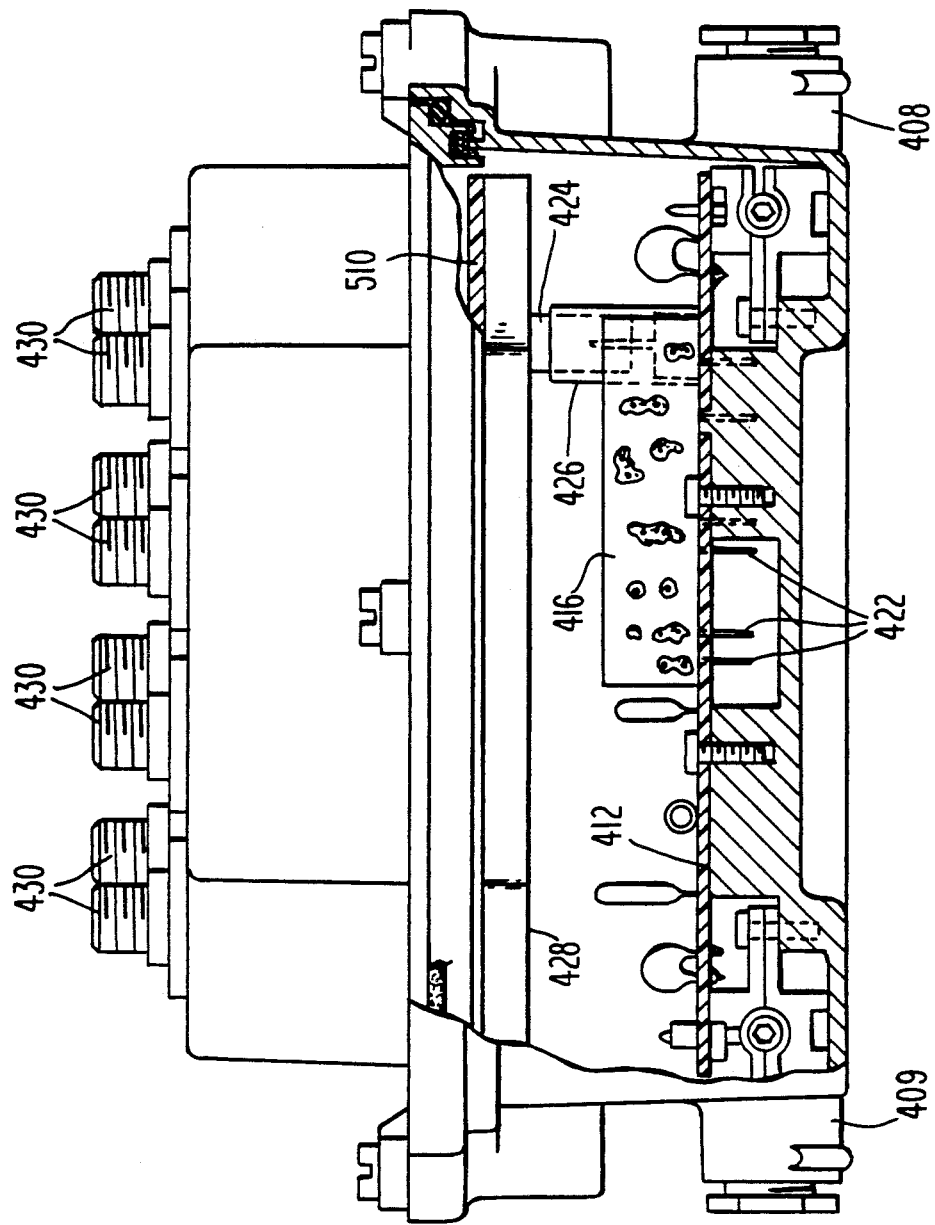
FIG. 5 is a cut-away side plan view of the tap unit shown in FIG. 4.

FIG. 5 is a cut-away side-plan view of the tap shown in FIG. 4. This Figure illustrates the physical coupling of the base unit directional coupler and splitter modules when the tap is assembled.

Figure 6:
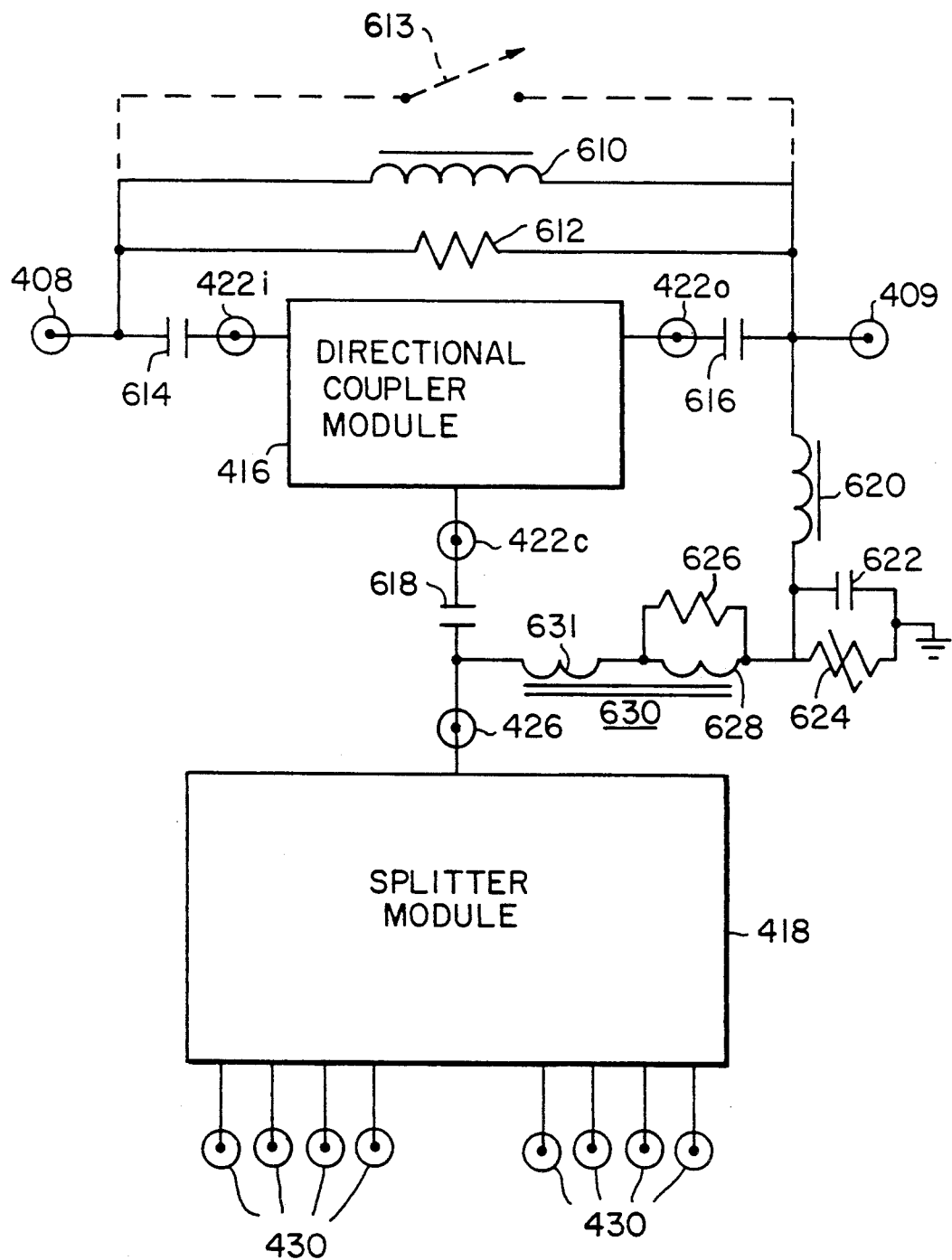
FIG. 6 is a schematic diagram, partially in block diagram form, of circuitry used in the tap unit shown in FIG. 4.

FIG. 6 shows circuitry suitable for use as the mother-board assembly 412. The directional coupler module 416 and splitter module 418 are shown as blocks to provide a context for describing the assembly 412. As set forth above, signals from the cable network are applied to the tap through the RF connector 408. The 60 Hz AC power signal is passed through an inductor 613 to the output RF connector 409. The inductor 613 is selected to provide negligible impedance to the 60 Hz power signal component of the cable television signal and to provide a relatively high impedance to the RF signal component.

In normal operation, the RF component of the cable television signal is passed through a coupling capacitor 614 to an output connector 422i of the mother-board assembly. This output connector is configured to receive an input connector 420i of the directional coupler 416. As described below, in reference to FIG. 7, the directional coupler 416 passes a portion of the RF signal to an output connector 420c which is coupled to the splitter module 418. However, most of the RF signal is passed through the coupler 416 to an output connector 420o. Connectors 422c and 422o on the mother-board assembly are configured to receive the connectors 420c and 420o of the directional coupler module. RF signals applied to the connector 422o are passed through a capacitor 616 to the output RF connector 409 of the tap.

When the directional coupler module 416 is removed from the tap for servicing, the RF component of the cable television signal may be passed through the tap by a resistor 612 or, alternatively by a switch 613 shown in phantom. The resistor 612 used in this embodiment of the invention has an impedance of 75 ohms. This impedance is significantly greater than the effective series impedance of any of the directional coupler modules 416. Consequently, when a directional coupler module is plugged into the mother board assembly, the resistor 612 passes only a relatively small portion of the RF signal.

The switch 613 represents an alternative method of passing the RF signal through the tap when the directional coupler is removed. The switch 613 shown in this alternative embodiment of the invention may be, for example, a normally closed switch which is held open by the directional coupler when it is plugged into the tap.

The mother-board assembly shown in FIG. 6 receives an RF signal from the directional coupler 412 via the connector 422d. This signal is coupled through a capacitor 618 to the RF connector 426 which supplies the RF signal and an AC operating power signal to the splitter module 418. In this embodiment of the invention, the AC power signal is passed through an inductor 620 and a inductor 630. These elements are selected to present a relatively small impedance to the 60 Hz AC power signal component and a relatively large impedance to the RF signal component of the cable television signal. The inductor 630 includes a primary winding 628 and a secondary winding 631. Each winding consists of a few (less than 10) turns of wire. The windings are wrapped around a ferrite core. A resistor 626 is coupled across the primary winding to reduce the magnitude of any change in impedance due to series self resonance of the inductor 630.

The power signal passing circuitry includes a capacitor 622 coupled between ground and the junction of the inductor 620 and the inductor 630. This capacitor sets the resonant frequency of the network which also includes the inductor 620 and the inductor 630 to a frequency below of the band of frequencies occupied by the RF signal component. A varistor 624 is coupled in parallel with the capacitor 622 to shunt voltage surges to ground. This resistor protects the circuitry in the splitter module from voltage surges produced, for example, by nearby lightning strikes.

The power passing circuitry couples the AC power signal to the RF signal at the junction of the capacitor 618 and RF connector 426. This combined signal is applied to the splitter module 41 to produce RF signals to be provided to the subscribers via the RF connectors 430. Circuitry suitable for use as the splitter module 418 is described below in reference to FIGS. 8, 9 and 10.

Figure 7:
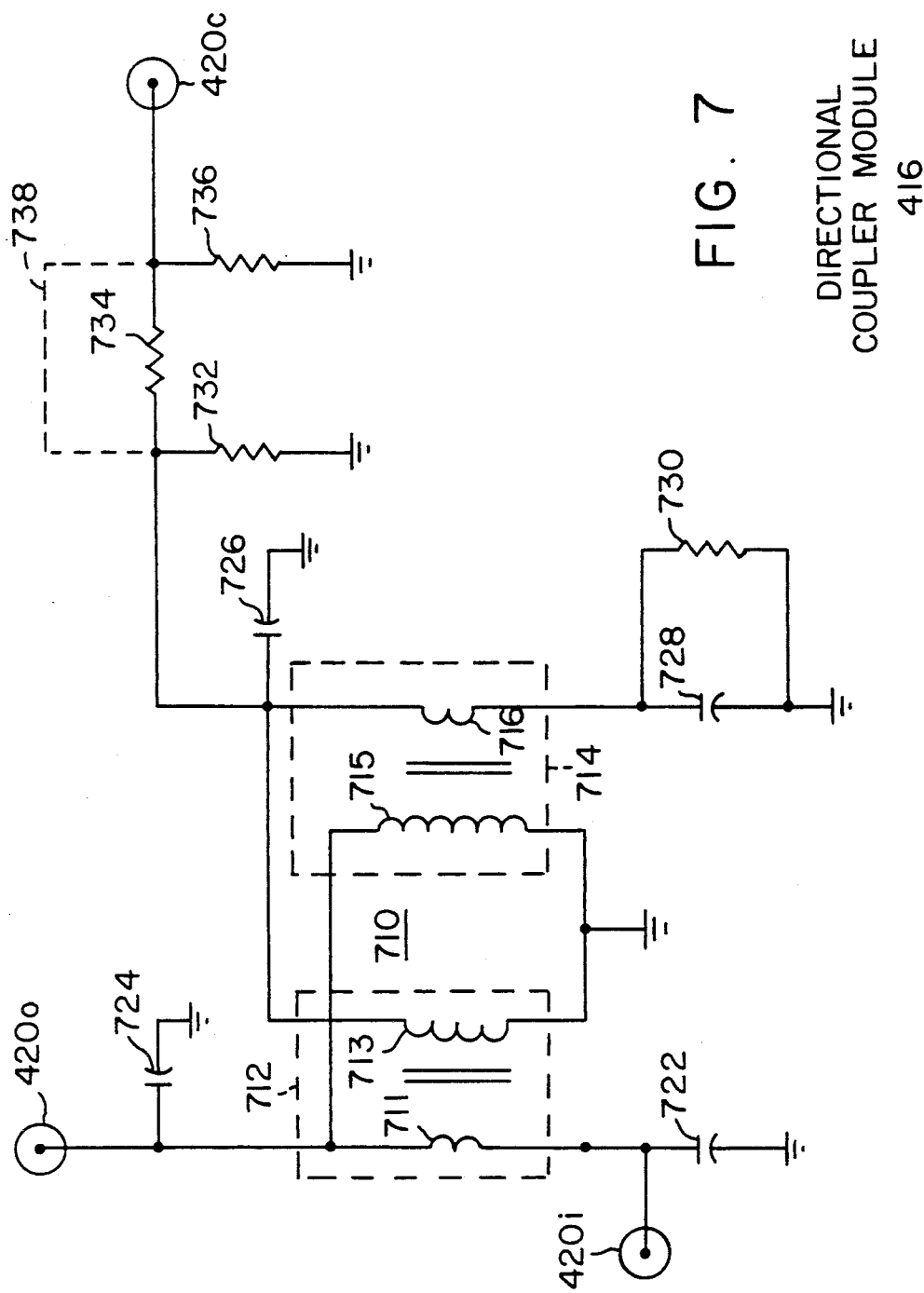
FIG. 7 is a schematic diagram of a signal coupler module suitable for use in the circuitry shown in FIG. 6.

FIG. 7 is a block diagram of circuitry suitable for use as the directional coupler module 416. The central element of the circuitry shown in FIG. 7 is a coupling transformer 710. The transformer 710 includes a current transformer 712 and a voltage transformer 714. The primary winding 711 of the current transformer 712 is coupled between an input connector 420i and an output connector 420o. The primary winding 715 of the voltage transformer 714 is coupled between the output connector 420o and ground. The output signals of the two transformers are combined and applied to a voltage divider network formed by resistors 732, 734 and 736. The resistor 734 may be replaced by a conductor as indicated in phantom by the jumper 738. The resistor 736 is coupled in parallel with the coupler output connector 420c. The voltage divider network matches the output impedance of the coupler to the input impedance of its load (i.e. to the circuitry coupled via the connector 420c). The resistor network also provides a method of adjusting the amount of power transferred to the load so that a defined tap-loss value may be realized.

The resistor 730 is included in the coupler to terminate the grounded end of the secondary winding 716 of the transformer 714. This resistor reduces the level of signals that may propagate from the output 420c and interfere with the RF component of the cable television signal. The circuitry shown in FIG. 7 is known as a directional coupler because it allows signals to propagate from the connector 420i to the coupler connector 420c more efficiently than from the connector 420c to the connector 420o.

The capacitor 728 is included to adjust the circuit impedance at the point at which the transformer 710 is attached. The capacitors 722, 724, and 726 are included in the circuitry to adjust the impedance presented at the respective connectors 420i, 420o and 420c. Each of these capacitors may have a capacitance of between 1 pf and 10 pf. The exact value used depends on the inductance of the various windings of the transformer 710.

As set forth above, 12 different types of coupler module are provided for use in this embodiment of the invention. The couplers are identified by their tap-loss values, where tap-loss is defined as the negative of ten times the logarithm of the ratio of the power provided at the connector 420i to the input power provided at the connector 420c. Tap-loss is expressed in units of decibels (dB). The 12 types of coupler module have tap-loss values of between 0 dB and 33 dB in steps of 3 dB. These tap-loss values are exemplary, it is contemplated that couplers may be made having tap-loss values in increments of 1 dB.

The 0 dB coupler is implemented as a conductor joining the terminals 420i and 420c. This coupler is used in a terminating tap such as the tap 130 shown in FIG. 1. The 3 dB coupler used in this embodiment of the invention is a two-way splitter such as that shown in FIG. 9. When the resistor 612 is included in the base unit circuitry, as described above in reference to FIG. 6, the tap-loss value for this type of coupler is approximately 4 dB.

The other ten couplers, having tap loss values between 6 dB and 33 dB, are directional couplers of the type shown in FIG. 7. A directional coupler may be designed to have a specific tap-loss value by selecting the number of turns of each of the windings 711, 713, 715 and 716 and the values of the resistors 732, 734 and 736. One skilled in the art of designing RF circuitry would be able to construct suitable circuitry without undue experimentation.

Figure 8:
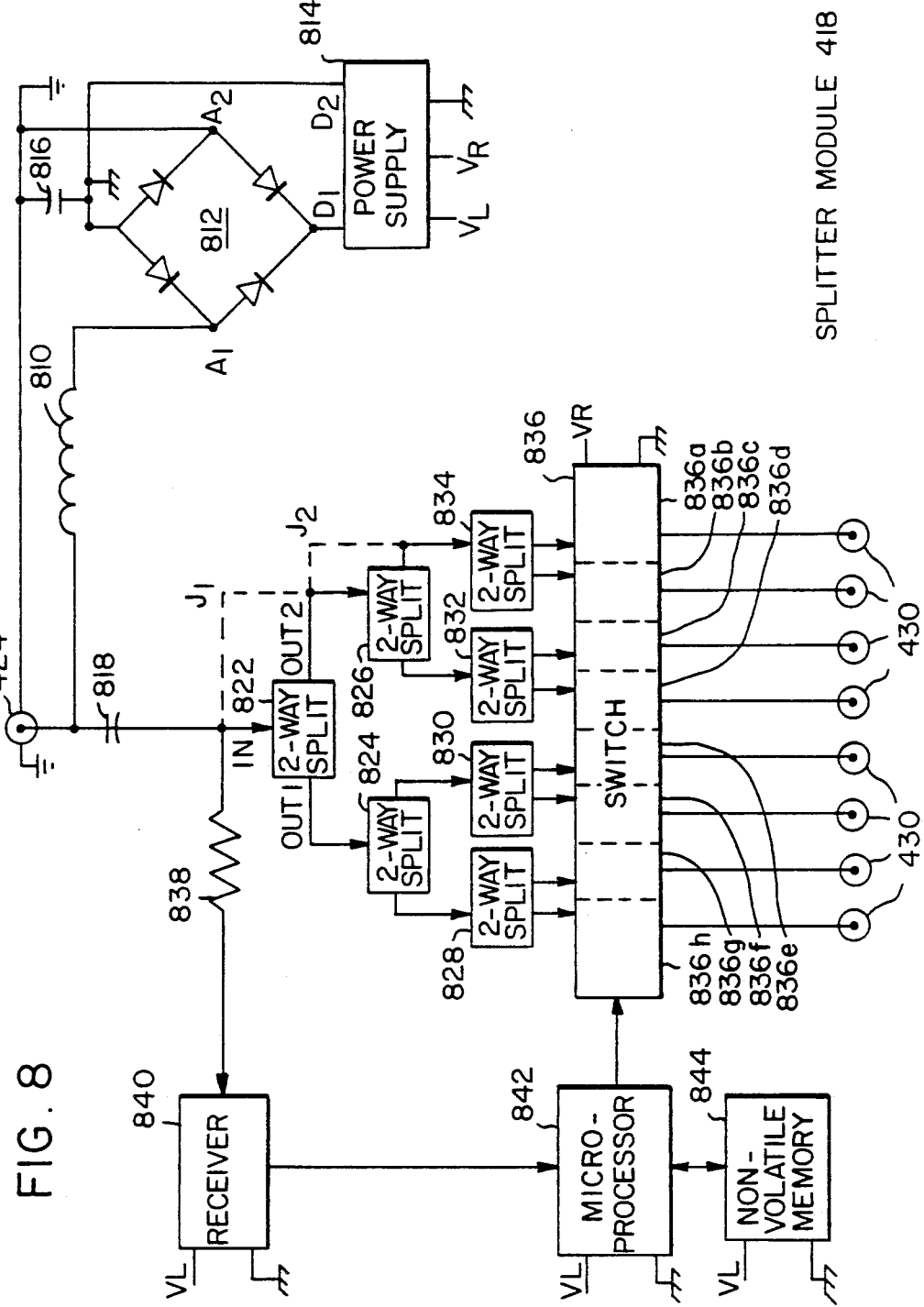
FIG. 8 is a block diagram, partially in schematic diagram form of a signal splitter module suitable for use in the circuitry shown in FIG. 6.

FIG. 8 is a block diagram, partially in schematic diagram form of circuitry suitable for use as the splitter module 418. In an overview, this circuitry includes a hierarchical signal splitting network which divides the RF signal energy into eight substantially equal parts. These eight signals are applied to a switching network 836 which, under control of a microprocessor 842, selectively provides the signals to subscribers via the RF connectors 430. The microprocessor receives command signals from the head-end of the cable system via a receiver 840. Thus, with the splitter module shown in FIG. 8, the tap unit shown in FIG. 6 is an addressable tap. It is contemplated that a passive tap unit may be used in place of the tap unit shown in FIG. 8.

The command signals used in this embodiment of the invention are frequency-shift keyed (FSK) signals that modulate a carrier having a frequency of approximately 51.5 MHz. This signal is outside of the band of frequencies occupied by the modulated television signals. These command signals are demodulated by a receiver 840 which provides its output signal to the microprocessor 842. In this embodiment of the invention, these commands condition the microprocessor to selectively disable or enable a subscriber connection to the cable network. The status of each subscriber connection is stored in a nonvolatile memory 844 which is coupled to the microprocessor 842. Operational power for the switching network 836, the microprocessor 842, the memory 844 and the receiver 840 is provided by a power supply 814.

In FIG. 8, the combined RF and operational power signal, provided by the mother-board assembly 412 and the directional coupler 416, is applied to the splitter module 418 via the RF connector 424. This signal is applied to an inductor 810 which passes the operational power signal to the relative exclusion of the RF signal. This power signal is applied to a first AC terminal, A1, of a bridge rectifier 812. Another AC terminal, A2, is coupled to the signal ground, provided by the shield connection of the RF connector 424.

The bridge rectifier 812 produces a DC operating potential between two terminals, D1 and D2. In this embodiment of the invention, the potential at terminal D1 is approximately +60 volts above the potential at terminal D2. The terminals D1 and D2 are coupled to the power supply circuitry 814. The potential at terminal D2 is defined as circuit ground. Different ground symbols are used to represent circuit ground and signal ground to emphasize that the circuit ground is "floating" with respect to signal ground. The circuit and signal grounds are coupled for AC signals by a coupling capacitor 816.

The power supply circuitry 814 may be of conventional design and is not described in detail. This circuitry provides a filtered signal VR having a potential with respect to the circuit ground of, for example, 60 volts. It also produces a voltage regulated signal, VL, which may have a potential of, for example five volts with respect to the circuit ground. The signal VR is used as an operational power signal by the switch network 836. The signal VL is used as an operational power signal by the receiver 840, microprocessor 842 and the non-volatile memory circuit 844.

Figure 9:
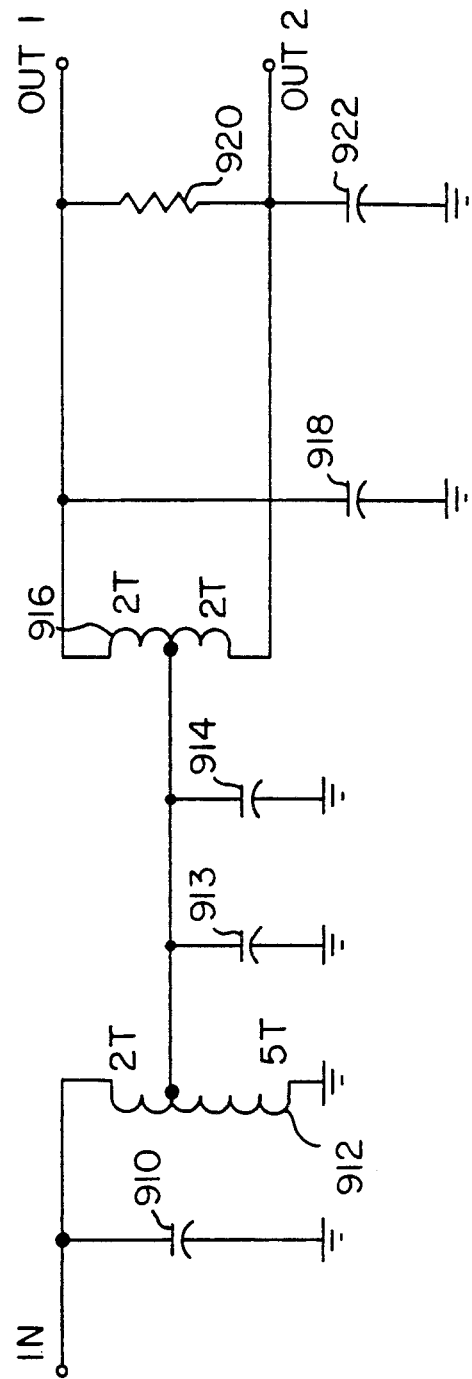
FIG. 9 is a schematic diagram of a two-way splitter suitable for use in the splitter module shown in FIG. 8.

The RF component of the signal applied to the connector 424 is passed by a capacitor 818 to a two-way splitter 822. Exemplary two-way splitter circuitry is shown in FIG. 9. The splitter 822 divides the signal applied to its input terminal, IN, into two approximately equal parts and provides these two signals at output terminals OUT1 and OUT2. The splitter module includes seven two-way splitters arranged hierarchically so that the two output terminals of the splitter 822 are coupled to input terminals of respective splitters 824 and 826. The splitter 824 is coupled to the splitters 828 and 830, while the output terminals of the splitter 826 are coupled to the respective splitters 832 and 834. The output terminals of the splitters 828, 830, 832 and 834 are coupled to the switch network 836.

The switch network 836 includes eight switch elements, 836a through 836h, one for each of the eight output signals provided by the four two-way splitters 834, 832, 830 and 828, respectively. Each switch element is separately controlled by the microprocessor 842 to selectively provide the television signal portion of the cable television signal to a subscriber via one of the RF connectors 430. An exemplary switch element is described below in reference to FIG. 10.

As set forth above, a splitter module may be configured to provide either two, four, six or eight subscriber connections. In the present embodiment of the invention, a single printed circuit board is used to implement all four types of splitter module. A particular configuration is achieved by inserting or removing two jumpers, J1 and J2 (shown in phantom), and by selectively depopulating sections of the printed circuit board that are not used in a given configuration.

For example, the exemplary splitter shown in FIG. 8 may be configured to have two subscriber ports by inserting the two jumpers J1 and J2 and by omitting all components corresponding to the splitters 822, 824, 826, 828, 830 and 832 as well as the components for the switch elements 836c through 836h. A splitter module having four subscriber ports would have only jumper J1 inserted. Components corresponding to the splitters 822, 824, 828 and 830 would be omitted as well as the components corresponding to the switch elements 836c through 836h. A six-port splitter module would have only the jumper J2 inserted. In this configuration, the components corresponding to the two-way splitters 826 and 832 and the switch elements 836c and 836d would be omitted. An eight-port splitter module has a fully populated printed circuit board and does not use either of the jumpers J1 or J2.

Figure 10:
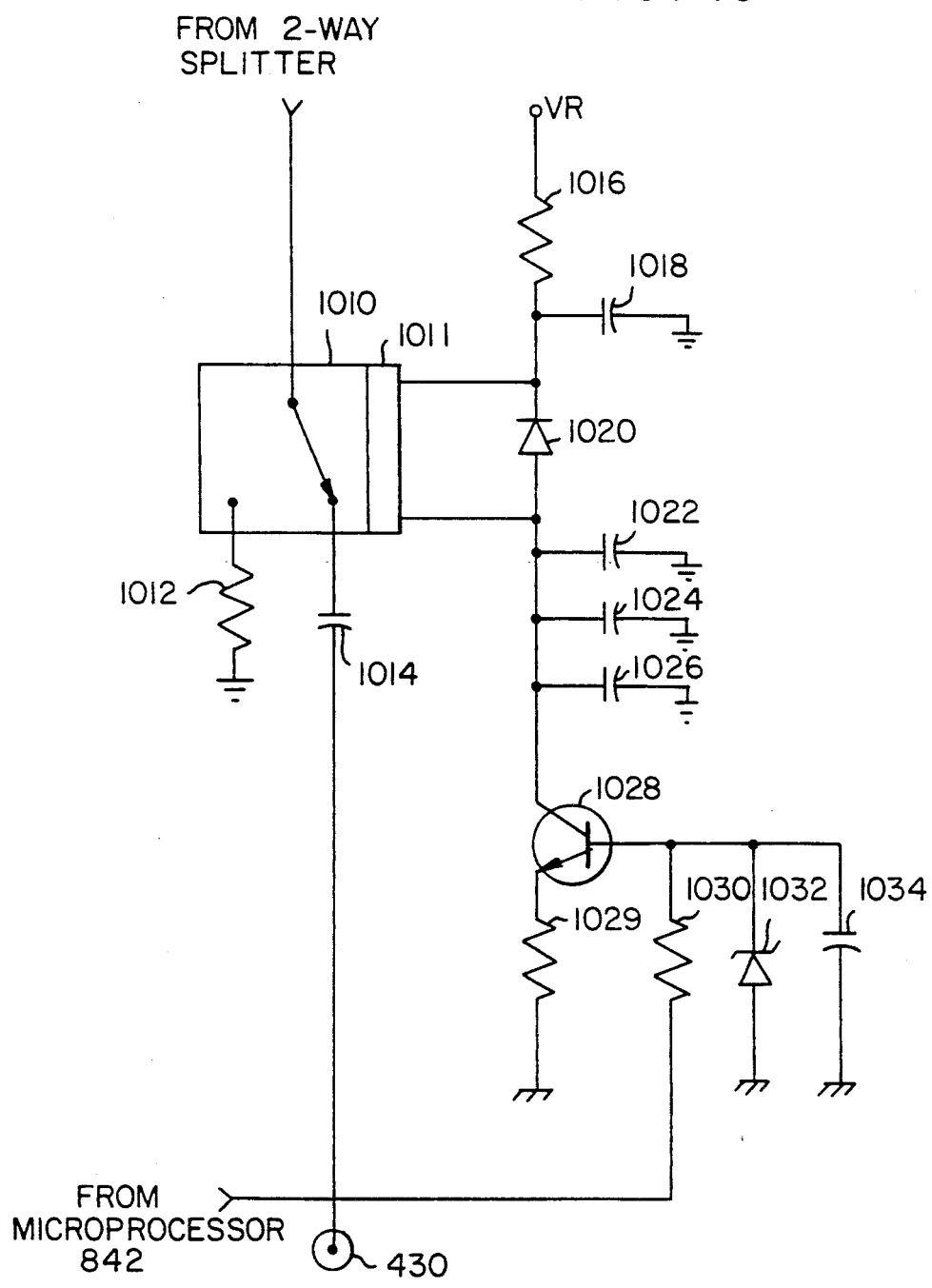
FIG. 10 is a schematic diagram of a portion of the switch circuitry shown in FIG. 8.

FIG. 10 is a schematic diagram of circuitry suitable for use as one of the switch elements 836a through 836h. RF signals provided by one of the two-way splitters 828, 830, 832 and 834 are applied to a signal input terminal of an RF relay 1010. The relay includes a coil 1011 which may be energized or de-energized to connect the signal input terminal to one terminal of a coupling capacitor 1014 or to a terminating resistor 1012, respectively. The other terminal of the capacitor 1014 is coupled to one of the subscriber RF connectors 430.

The relay coil 1011 is energized by circuitry which includes a driver transistor 1028. This transistor is biased point of fixed operating current by an emitter resistor 1029 and a zener diode 1032. A control signal from the microprocessor 842 is applied to the base terminal of the transistor 1028 via a resistor 1030. The amplitude of this control signal is limited by the zener diode 1032. The capacitors 1018, 1022, 1024 and 1026 are bypass capacitors which conduct any RF signals which may be induced on the connections between the transistor 1028, the relay 1010 and the power supply 814 to ground. These RF signals may be induced by transmission line effects of these connections. It is contemplated that the three capacitors 1022, 1024 and 1026 may be replaced by a single capacitor. The capacitor 1034 is a bypass capacitor which shunts any RF signals carried by the control signal to the circuit ground.

A logic-one control signal from the microprocessor 842 conditions the transistor 1028 to conduct the fixed current between its emitter and collector electrodes, energizing the relay independent of changes in VR. When the microprocessor 842 changes the signal to a logic-zero, the transistor ceases to conduct and the relay is de-energized. Thus, when a subscriber is to be connected to the cable system, the control signal from the cable television network conditions the microprocessor 842 to apply a logic-one control signal to the switch element which couples the subscriber to the network. This signal energizes the relay, connecting the subscriber. A logic-zero control signal disconnects the subscriber.

When the relay is de-energized, the cable connection is terminated via the resistor 1012. This prevents amplitude response changes at the other subscriber ports and maintains the signal input impedance of the splitter module at a substantially constant value. Moreover, the signal to the former subscriber is reduced by approximately 60 dB. The RF relays are more effective than conventional solid-state switches which may require more complex circuitry to achieve an equivalent level of attenuation and which may also produce undesirable intermodulation products between the RF carriers of the cable television signal.

Since subscriber information is stored in the nonvolatile memory 844 of the tap unit, this information is not lost when the tap loses operational power. Each subscriber is automatically reconnected when operational power returns.

| Resistors: | 612, 730, 1012 | 75 ohm |
|---|---|---|
| | 624 | 1.1 K ohm |
| | 626 | 102 v varistor |
| | 838 | 470 ohm |
| | 920, 1016 | 10 ohm |
| | 1029 | 130 ohm |
| | 1030 | 1 K ohm |
| Capacitors: | 614, 616, 618, 622, 818, 1014 | .01 microfarad |
| | 728 | 1.5 picofarad |
| | 816 | .02 microfarad |
| | 910 | 1.8 picofarad |
| | 913 | 3.3 picofarad |
| | 914 | 4.3 picofarad |
| | 918 | 5 picofarad |
| | 922 | 2 picofarad |
| | 1022, 1026 | 270 picofarad |
| | 1024, 1034 | 1000 picofarad |
| Semiconductors: | 1020 | 1N4004 |
| | 1028 | MPSA42 |
| | 1034 | 2.4 volt zener diode |
| Relay: | 1010 | UM1-48W-K Mfd. by Takamisawa Corp. |

A modular tap for an RF signal distribution network has been described. This apparatus has significant advantages over prior systems since it reduces the number and size of the components used by a cable television operator to build and maintain a distribution system. The apparatus described above has significant safety advantages since only relatively low levels of operational power are broken when components of the tap unit are removed for servicing.

While the invention has been described in terms of an exemplary embodiment, it is contemplated that it may be practiced as outlined above with modifications within the scope of the appended claims.

The invention claimed is:

1. In a system for distributing a signal having a radio frequency component and an operational power signal component over a network of radio frequency cables, a signal tap unit comprising:
    base means, including:
        an input port coupled to receive the distributed signal from a first one of said radio frequency cables;
        an output port, coupled to a second one of said radio frequency cables;
        means for separating the radio frequency signal component and the operational power signal component from said distributed signal; and
        means for coupling the operational power signal component to said output port; and
    signal coupling means, mechanically removably coupled to said base means, for receiving, when coupled to said base means, said separated radio frequency signal component to the substantial exclusion of the operational power signal component, and for providing said separated radio frequency signal component at an output terminal;
    wherein, said base means further includes means for coupling the radio frequency signal component to said output port when said signal coupling means is removed from said base unit;

2. The tap unit set forth in claim 1 wherein said means for coupling the radio frequency signal component to the output port includes a signal bypass resistor.

3. The tap unit set forth in claim 1 wherein said means for coupling the radio frequency signal component to the output port includes signal switching means which is conditioned to be open when the coupling means is coupled to the base means and which is conditioned to be closed when the coupling means is not coupled to the base means.

4. In a system for distributing a signal having a radio frequency component and an operational power signal component over a network of radio frequency cables, a reconfigurable signal tap unit comprising:
    base means, having an input port coupled to receive the distributed signal from a first one of said radio frequency cables, means for separating the radio frequency signal component and the operational power signal component from said distributed signal and an output port for providing at least said operational power signal component to a second one of said radio frequency cables;
    signal coupling means, mechanically removably coupled to said base means, for receiving, when coupled to said base means, said separated radio frequency signal component to the substantial exclusion of the operational power signal component, and for providing said separated radio frequency signal component at an output terminal; and
    signal splitting means, mechanically removably coupled to said base means, for receiving, when coupled to said base means, the radio frequency signal component provided by said coupling means, for separating said radio frequency signal into a plurality of output signals and for providing said plurality of output signals at a respective plurality of output terminals
    wherein said base means is adapted to accept one of N signal coupling means, having respectively different operational characteristics, and one of M signal splitting means, providing respectively different numbers of output signals, to exhibit one of N times M respectively different configurations, where N and M are integers.

5. The tap unit set forth in claim 4 wherein said distributed signal further includes command signals and said signal splitting means further includes addressable coupling means responsive to said command signals for selectively coupling at least one of said plurality of output signals to the respective one of said plurality of output terminals.

6. The tap unit set forth in claim 4 wherein said base unit further includes:
    means for combining the separated radio frequency signal component provided by said coupling means with said operational power signal to produce a compound signal; and a compound signal output terminal for applying said compound signal to said signal splitting means.

7. The tap unit set forth in claim 6 wherein said compound signal output terminal is a radio frequency connector.

8. The tap unit set forth in claim 7 wherein:
said radio frequency signal component of said distributed signal includes a command signal; and
said signal splitting means further includes:
switch means, responsive to a control signal for selectively coupling at least one of said plurality of output signals to the respective one of said output terminals;
means for receiving said command signal; and
means responsive to said received command signal for generating said control signal for application to said switch means.

9. The tap unit set forth in claim 8 wherein said switch means includes radio frequency switching means having a signal input terminal coupled to receive said one output signal, a first signal output terminal coupled to said one output terminal and a second signal output terminal coupled to a terminating impedance; said radio frequency switching means being responsive to said control signal being in first and second states for selectively connecting said signal input terminal to said first and second signal output terminals, respectively.

10. In a system for distributing a cable television signal, including an operational power signal component and a radio frequency component, to a plurality of subscribers via a network of radio frequency cables, a modular signal tap comprising:
a base module including
an input port coupled to receive said cable television signal from one of said radio frequency cables;
means for separating said operational power signal component and said radio frequency signal component from said cable television signal; and
means for providing at least said operational power signal component to a further one of said radio frequency cables;
a signal coupling module removably coupled to said base module for receiving the separated radio frequency signal component to the substantial exclusion of the operational power signal component and for providing at least a portion of said separated radio frequency signal component at an output terminal; and
a signal splitting module removably coupled to said base module and to the output terminal of said signal coupling module for receiving the radio frequency signal provided thereby and for dividing said received radio frequency signal into a plurality of signals for distribution to respective ones of said subscribers; wherein said base module is adapted to accept one of N signal coupling modules, having respectively different operational characteristics, and one of M signal splitting modules, having respectively different numbers of subscriber taps, to exhibit one of N times M respectively different configurations, where N and M are integers.

* * * * *